United States Patent
Lindsay

(10) Patent No.: US 7,678,630 B2
(45) Date of Patent: Mar. 16, 2010

(54) STRAINED SEMICONDUCTOR DEVICE AND METHOD OF MAKING SAME

(75) Inventor: Richard Lindsay, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 665 days.

(21) Appl. No.: 11/354,616

(22) Filed: Feb. 15, 2006

(65) Prior Publication Data

US 2007/0190741 A1 Aug. 16, 2007

(51) Int. Cl.
*H01L 21/336* (2006.01)
(52) U.S. Cl. .................. 438/197; 257/65; 257/E21.618
(58) Field of Classification Search .......... 257/E21.618, 257/65; 438/197
See application file for complete search history.

(56) References Cited

U.S. PATENT DOCUMENTS

| | | | |
|---|---|---|---|
| 5,447,884 A | 9/1995 | Fahey et al. | |
| 5,693,546 A | 12/1997 | Nam et al. | |
| 5,792,679 A | 8/1998 | Nakato | |
| 5,972,761 A | 10/1999 | Wu | |
| 5,989,978 A | 11/1999 | Peidous | |
| 6,046,487 A | 4/2000 | Benedict et al. | |
| 6,069,049 A | 5/2000 | Geiss et al. | |
| 6,271,068 B1 | 8/2001 | Hsu et al. | |
| 6,573,172 B1 | 6/2003 | En et al. | |
| 6,657,276 B1 | 12/2003 | Karlsson et al. | |
| 6,730,583 B2 | 5/2004 | Oh et al. | |
| 6,808,970 B2 | 10/2004 | Feudel et al. | |
| 6,890,808 B2 | 5/2005 | Chidambarrao et al. | |
| 6,900,502 B2 | 5/2005 | Ge et al. | |
| 6,939,814 B2 | 9/2005 | Chan et al. | |
| 6,943,391 B2 | 9/2005 | Chi et al. | |
| 6,952,289 B1 | 10/2005 | Fujimoto et al. | |
| 7,094,671 B2 | 8/2006 | Li | |
| 7,307,273 B2 * | 12/2007 | Currie | .......................... 257/18 |
| 7,341,902 B2 * | 3/2008 | Anderson et al. | ........... 438/197 |
| 7,488,670 B2 * | 2/2009 | Knoefler et al. | ............. 438/473 |
| 2002/0055241 A1 | 5/2002 | Oh et al. | |
| 2003/0146494 A1 | 8/2003 | Puchner et al. | |
| 2003/0227036 A1 | 12/2003 | Sugiyama et al. | |
| 2004/0212035 A1 | 10/2004 | Yeo et al. | |
| 2004/0221792 A1 | 11/2004 | Forbes | |
| 2004/0232513 A1 | 11/2004 | Chi et al. | |
| 2005/0136583 A1 | 6/2005 | Chen et al. | |

(Continued)

FOREIGN PATENT DOCUMENTS

DE    10 2006 030 647 A1    2/2007

OTHER PUBLICATIONS

Chan, V., et al., "Strain for CMOS Performance Improvement," IEEE 2005 Custom Integrated Circuits Conference, 2005, pp. 667-674.

(Continued)

*Primary Examiner*—W. David Coleman
*Assistant Examiner*—Sun M Kim
(74) *Attorney, Agent, or Firm*—Slater & Matsil, L.L.P.

(57) ABSTRACT

A method of making a semiconductor device is disclosed. An upper surface of a semiconductor body is amorphized and a liner is formed over the amorphized upper surface. The upper surface can then be annealed. A transistor is formed at the upper surface.

29 Claims, 8 Drawing Sheets

U.S. PATENT DOCUMENTS

| | | |
|---|---|---|
| 2005/0224798 A1 | 10/2005 | Buss |
| 2005/0255667 A1 | 11/2005 | Arghavani et al. |
| 2005/0260806 A1 | 11/2005 | Chang et al. |
| 2006/0046367 A1* | 3/2006 | Rotondaro et al. ........... 438/199 |
| 2006/0099765 A1* | 5/2006 | Yang ........................... 438/301 |
| 2007/0012960 A1 | 1/2007 | Knoefler et al. |

OTHER PUBLICATIONS

Chen, C-H, et al., "Stress Memorization Technique (SMT) by Selectively Strained-Nitride Capping for Sub-65nm High-Performance Strained-Si Device Application," 2004 Symposium on VLSI Technology Digest of Technical Papers, 2004, pp. 56-57, IEEE.

Jae-Geun, O., et al., "Method for Fabricating Semiconductor Device," Mar. 11, 2003, Hynix Semiconductor Inc., Taiwan English Abstract of TW523869B, 1 Page.

Chi, M.-H., et al., "Modification of Carrier Mobility in a Semiconductor Device," Jun. 1, 2005, Taiwan Semiconductor Manufacturing Co. Ltd., English Abstract of TW 200518239, 1 Page.

Chen, C.H., et al., "Advanced Strained-Channel Technique to Improve CMOS Performance," Jul. 1, 2005, Taiwan Semiconductor Manufacturing Co. Ltd., English Abstract of TW 200522348, 1 Page.

* cited by examiner

STRAINED SEMICONDUCTOR DEVICE AND METHOD OF MAKING SAME

TECHNICAL FIELD

This invention relates generally to semiconductor devices and methods, and more particularly to devices and methods for modulating stress in transistors in order to improve performance.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. In addition, higher conductivity materials, such as copper, are replacing lower conductivity materials, such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility and performance boost of devices. For example, stress can be provided by a contact etch stop layer (CESL), single layers, dual layers, stress memory transfer layers, and STI liners. Most of these techniques use nitride layers to provide tensile and compressive stresses; however other materials can be used in other applications, e.g., HDP oxide layers.

Another method of inducing strain into the transistor utilizes a modified shallow trench isolation (STI) region. One method includes lining a STI recess with a stressor before filling the recess with a dielectric. The stressor can then impart a stress onto the adjacent semiconductor.

SUMMARY OF THE INVENTION

In one embodiment method of making a semiconductor device, a semiconductor body is provided. An upper surface of the semiconductor body is amorphized and a liner is formed over the amorphized upper surface. The upper surface can then be annealed. A transistor is formed at the upper surface.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for improving carrier mobility in a CMOS device. Concepts of the invention can also be applied, however, to other electronic devices. As but one example, bipolar transistors (or BiCMOS) can utilize concepts of the present invention.

FIGS. 1 and 2 will first be used to describe one theory behind a basic concept of embodiments of the invention. An exemplary transistor device is shown in FIG. 3 and various methods for the formation of transistor devices using these concepts will then be described with respect to FIGS. 4-8.

The theory described herein is provided to aid in understanding. It must be understood, however, the invention is not bound by this theory. Experimental results show that stress remains in recrystallized silicon when topography exists. The explanations provided herein are the inventor's best understanding of why these phenomena occur.

Figure 1A:
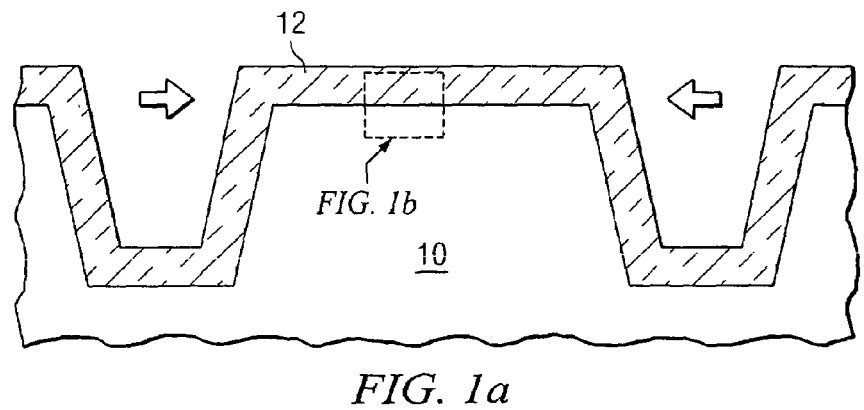
FIGS. 1a, 1b, 2a and 2b illustrate diagrams to explain one theory behind concepts of the present invention.
Figure 1B:
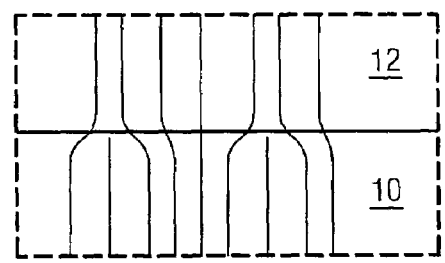
Figure 2A:
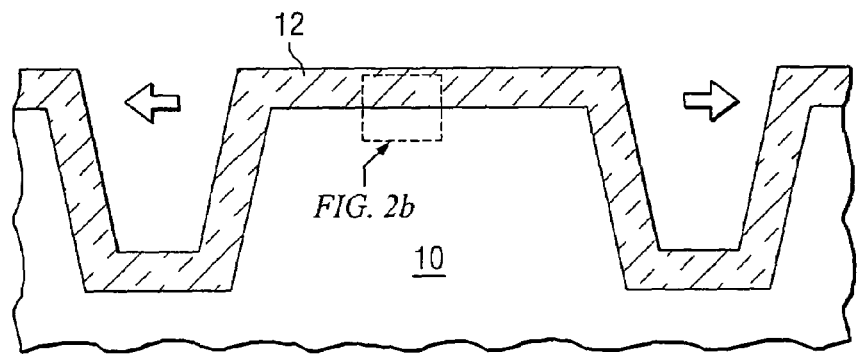
Figure 2B:
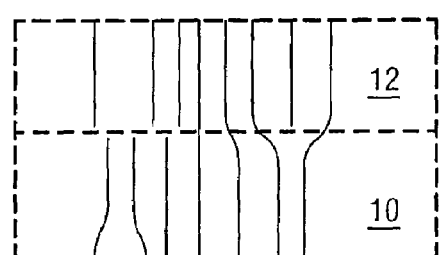
Figure 3:
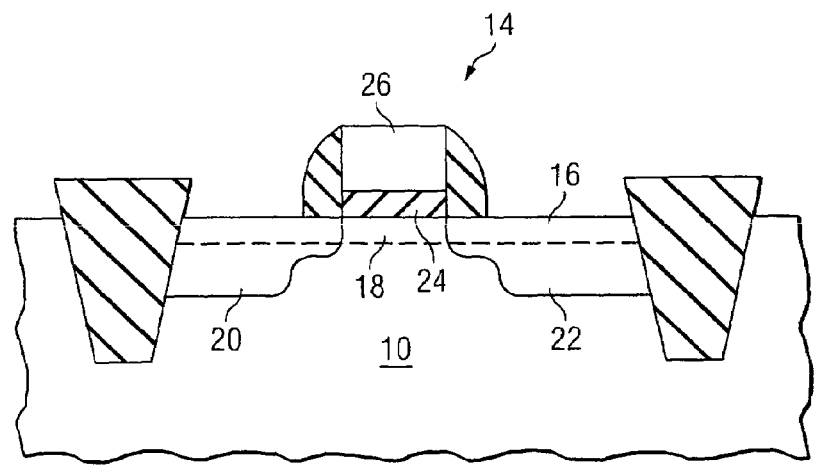
FIG. 3 illustrates a transistor device fabricated using concepts of the present invention.

In both FIG. 1, which includes FIGS. 1a and 1b, and FIG. 2, which includes FIGS. 2a and 2b, a semiconductor body 10 has a stress inducing layer 12 formed thereon. In the embodiment of FIG. 1, the layer 12 is a tensile liner, which can create a locally compressive stress in the semiconductor 10. This structure can be used preferentially for n-channel devices. In the embodiment of FIG. 2, the layer 12 is a compressive liner, which creates a tensile stress in the semiconductor 10. This structure can be used, for example, for p-channel devices.

In other embodiments, a compressive stress could benefit a p-channel device and/or a tensile stress could benefit an n-channel device. For example, it is possible that under certain geometries (e.g., edges) the strain could be opposite, i.e., a tensile liner may leave the substrate compressive in parts, e.g., at the edges. (It is also possible that the theory is inaccurate, leading to stresses different than those described herein.) As will be discussed below, in some embodiments, a biaxial stress will be created, thereby opening up possibilities for both pMOS and NMOS improvements with a tensile stress in the silicon.

FIGS. 1b and 2b show a representation of the boundary at the molecular level (and are clearly not to scale relative to FIGS. 1a and 2b).

The process illustrated in FIGS. 1 and 2 utilizes a stress memory technique at a point in the process flow before transistors are formed. One goal is to include stress in the channel of these to be formed transistors by amorphizing the upper surface and forming a stress liner after etching isolation trenches, but before fabricating the transistors. In this process, the entire active area for any given transistor is stressed so that the larger volume (e.g., larger area and/or larger depth) of semiconductor that is stressed should lead to a higher stress level. A deeper amorphization will lead to higher stress levels. Since this approach is performed before the gate is formed, the amorphization can be deeper than the gate height.

FIG. 1 shows the active area 10 for an n-channel transistor. In this case, a compressive stress can be generated from a tensile liner. Upon crystallization, the tensile liner 12 compresses the silicon at the amorphous interface of semiconductor body 10 such that some lattice planes stop growing. When the liner 12 is removed, a tensile stress is left in the active area. A transistor (see e.g., FIG. 3) can then be formed in the active area.

Similarly, FIG. 2 shows the active area 10 for a p-channel transistor. In this case, a tensile stress can be generated from a compressive liner. Upon crystallization, the compressive liner 12 stretches the amorphous silicon such that additional lattice planes grow. When the liner 12 is removed, a compressive stress is left in the active area. Once again, the transistor can be formed in the active area.

As a general point, in some cases, a local topography (e.g., near 90 degree edges) is needed to transfer stress from the liner to the silicon during regrowth. The theory is that if you have a flat film, each point in the film has a force pushing from left and right on the silicon, whereas at a 90° edge, there is only force in one direction (the other part is missing). This is shown in the FIG. 1a (by the arrows). Thus a flat, bare silicon wafer simply might not be significantly stressed—only at the wafer edges. From experiment, the stress is highest with maximum topography, with less stress remaining without edges.

FIG. 3 shows a transistor device 14 formed in the semiconductor body 10. In particular, the upper surface of the semiconductor body is formed as a stress memory transfer layer 16 (e.g., a strained semiconductor layer that was originally amorphized). The stress memory transfer layer 16 extends throughout the active area and can be formed as described above. In many embodiments, the stress memory layer 16 may be much deeper than illustrated in FIG. 3, typically half way between the bottom of the STI and the bottom of the doped region 20. Various specific examples are provided below. In the illustration of FIG. 3, a transistor device is formed.

The transistor 14 includes a channel region 18 disposed in the stress memory transfer layer 16. A gate dielectric 24 overlies the channel region 18 and a gate electrode 26 overlies the gate dielectric 24. A source region 20 and a drain region 22 are disposed in the semiconductor body and spaced from each other by the channel region 18. In one example, the stress memory layer 16 is a tensile stress layer and the source region 20 and the drain region 22 are n+ regions (and the transistor is therefore an n-channel transistor). In another example, the stress memory layer 16 is a compressive stress layer and p+ source and drain regions 20 and 22 form a p-channel transistor.

In other embodiments, other semiconductor devices and elements can be fabricated in the stress memory transfer layer 16. For example, if the doped regions 20 and 22 are formed of opposite polarities, the device 14 can be operated as a diode. In another example, the doped regions 20 and 22 can be used as contacts to one plate of a capacitor while the gate electrode 26 is used as another gate of a capacitor. This capacitor could be used, for example, as a decoupling capacitor between supply lines (e.g., $V_{DD}$ and ground) on a semiconductor chip.

FIGS. 4-8 will now be provided to illustrate various embodiments for forming a semiconductor device of the present invention. While certain details may be explained with respect to only one of the embodiments, it is understood that these details can also apply to other ones of the embodiments.

Figure 4A:
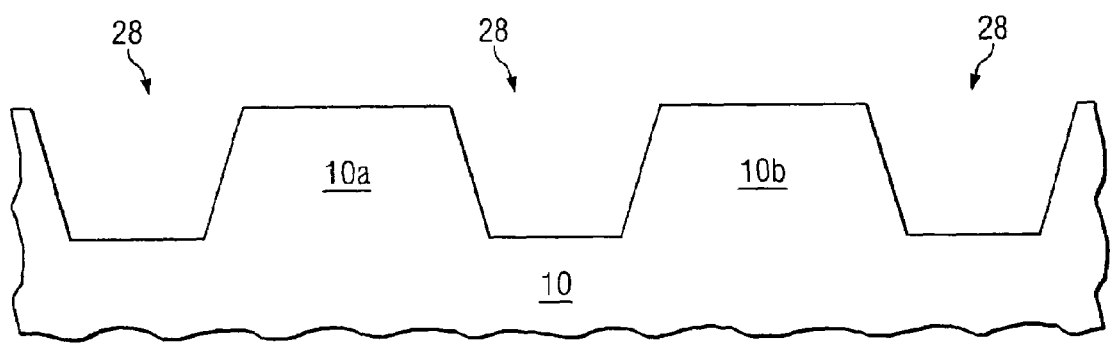
FIGS. 4a-4f provide cross-sectional views of a first embodiment process.

Referring first to FIG. 4a, a semiconductor body 10 is provided. In the preferred embodiment, the semiconductor body 10 is a silicon wafer. For example, the body 10 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer.

In the first embodiment, isolation trenches 28 are formed in the semiconductor body 10. These trenches 28 can be formed using conventional techniques. For example, a hard mask layer (not shown here, see FIG. 8a), such as silicon nitride can be formed over the semiconductor body 10 and patterned to expose the isolation areas. The exposed portions of the semiconductor body 10 can then be etched to the appropriate depth. The trenches 28 define active areas 10 and 10b, in which integrated circuit components can be formed. In a conventional process, the trenches would then be filled with an insulator. In this embodiment, on the other hand, further processing occurs first.

Figure 4B:
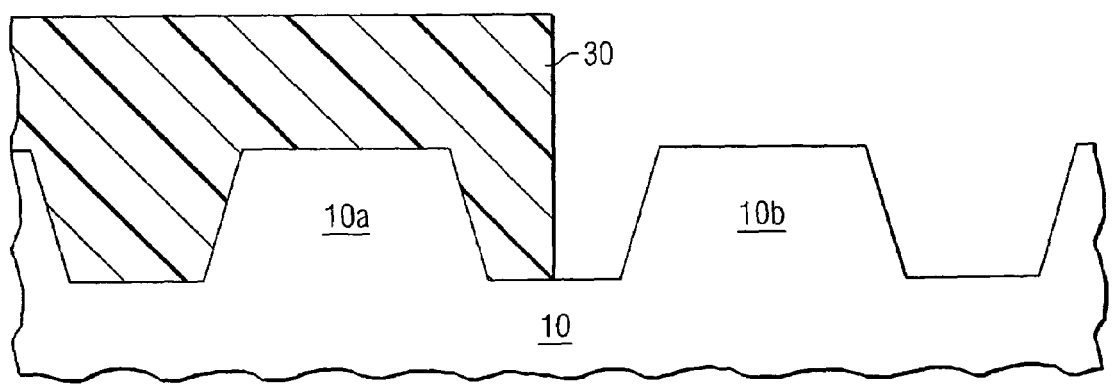

FIG. 4b illustrates the formation of a resist layer 30 over one of the active regions 10a. Accordingly, active region 10b is left exposed. Before depositing the resist layer 30, the pad nitride used to mask the trenches 28 can be removed or thinned down to maximize stress transfer between the stress liner 12 (to be formed in FIG. 4d) and the active region 10b. For some embodiments, however, the pad nitride could also be deposited tensile such that is does not need to be removed. It is also possible to for STI with a thin enough pad nitride/oxide for CMP later.

The resistor layer 30 can be any standard positive or negative tone photoresist, as an example. In another example, a sacrificial layer, such as an oxide or a nitride can be formed. In either case, the resist should be thick enough to prevent substantial amorphization of the underlying semiconductor.

In FIG. 4b, the resist is drawn to cover half of one of the trenches 28. It is noted that this type of processing can be difficult (but is certainly possible). For most purposes, it is sufficient to stop the resist anywhere in the trench 28 or over the active area 10a or 10b adjacent the trench. In various embodiments, the effects of the amorphization at the sidewall of the trench will be small since the amorphous layer is thin.

Figure 4C:
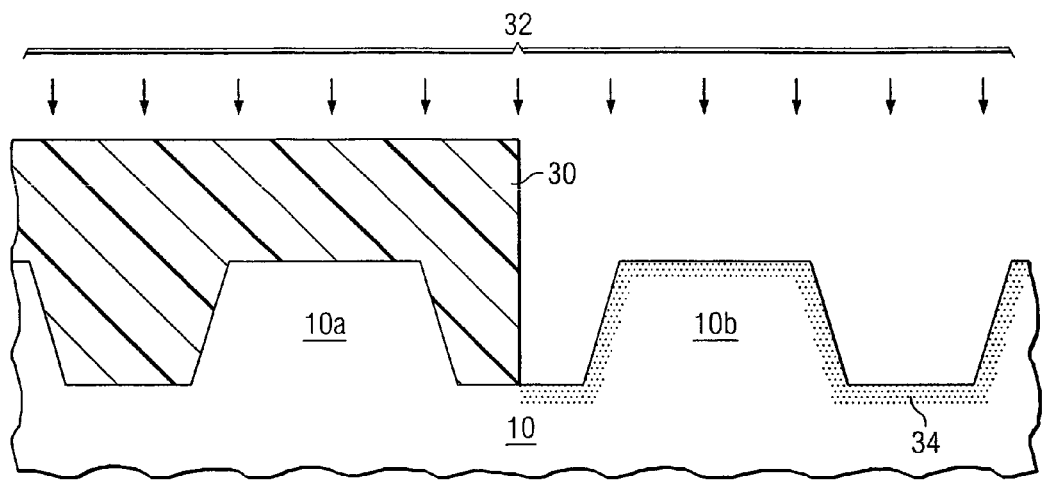

Referring now to FIG. 4c, the upper surface of the exposed active area 10b is amorphized. In the preferred embodiment, germanium ions, which are depicted by the arrows 32, are implanted into a silicon body 10b. For example, germanium ions can be implanted with a dose of about $10^{14}$ cm$^{-2}$ to about $10^{16}$ cm$^{-2}$ and an implant energy between about 5 keV and about 200 keV. In other embodiments, other materials, such as Xe, As, can be implanted.

The amorphization step creates an amorphous layer 34 at the exposed upper surface of the semiconductor body. In particular, the upper portion of active area 10b will be in an amorphous state. This layer 34 may typically be between about 10 nm and about 300 nm. Because of the resist layer 30, the active area 10a will be unaffected, or at least substantially unaffected, by the amorphization process.

Figure 4D:
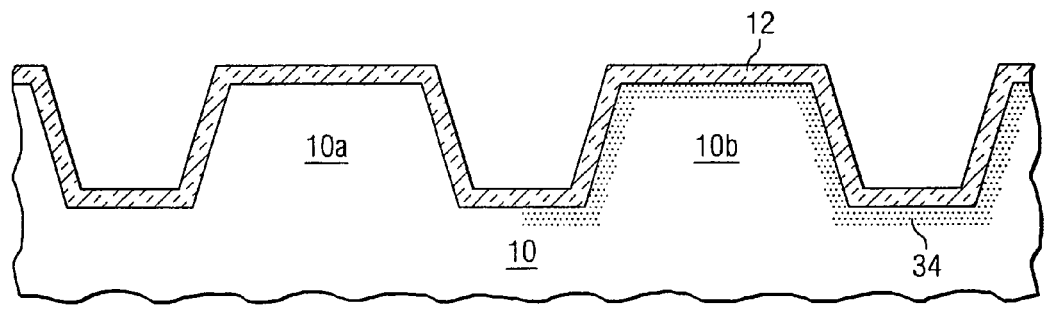

As shown in FIG. 4d, the resist layer 30 is removed and a liner 12 is deposited. The liner 12 is preferably a stress-inducing liner, as discussed above. For example, a nitride film (e.g., silicon nitride) is deposited in such a way as to create a stress between the film 12 and the underlying semiconductor 10. For a silicon nitride liner, typically the Si—N to Si—H bonding influences the stress direction—the lower Si—H to Si—N ratio, the more tensile. As is known in the art, deposition rate, pressure, UV curing, and other factors dictate this ratio.

Figure 4E:
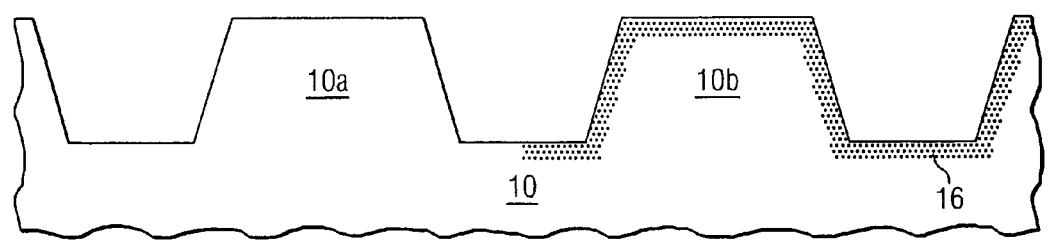

FIG. 4e depicts the structure after the amorphous layer is recrystallized to form stress memory layer 16 over the active area 10b. In the preferred embodiment, a regrowth anneal is performed so that the crystalline structure is affected by stresses created by liner 12 in the active area 10b. Since the active area 10a was not amorphized, the crystalline structure of this region should not be substantially affected by the regrowth anneal (e.g., the elasticity of the silicon crystal will allow the region to regain shape after liner removal). After performing the regrowth anneal, an additional rapid thermal anneal (RTA) can optionally be applied. The regrowth anneal and optional RTA can be the same type of anneal (e.g., RTA) or different types of anneals, e.g., furnace anneal or a laser anneal.

In embodiments where a uniaxial stress is created, it has been found to be desirable to use a low temperature anneal for a compressive stressed semiconductor and a high temperature anneal for a tensile stressed semiconductor. (The theory is that H out-diffuses to give a lower Si—H/Si—N bond ratio as mentioned above.) For example, the low temperature recrystallization anneal can be performed at a temperature less than about 700° C., for example at between about 500° C. and about 600° C. The high temperature anneal can be performed at a temperature greater than about 1000° C., for example at between about 1100° C. and 1200° C.

Figure 4F:
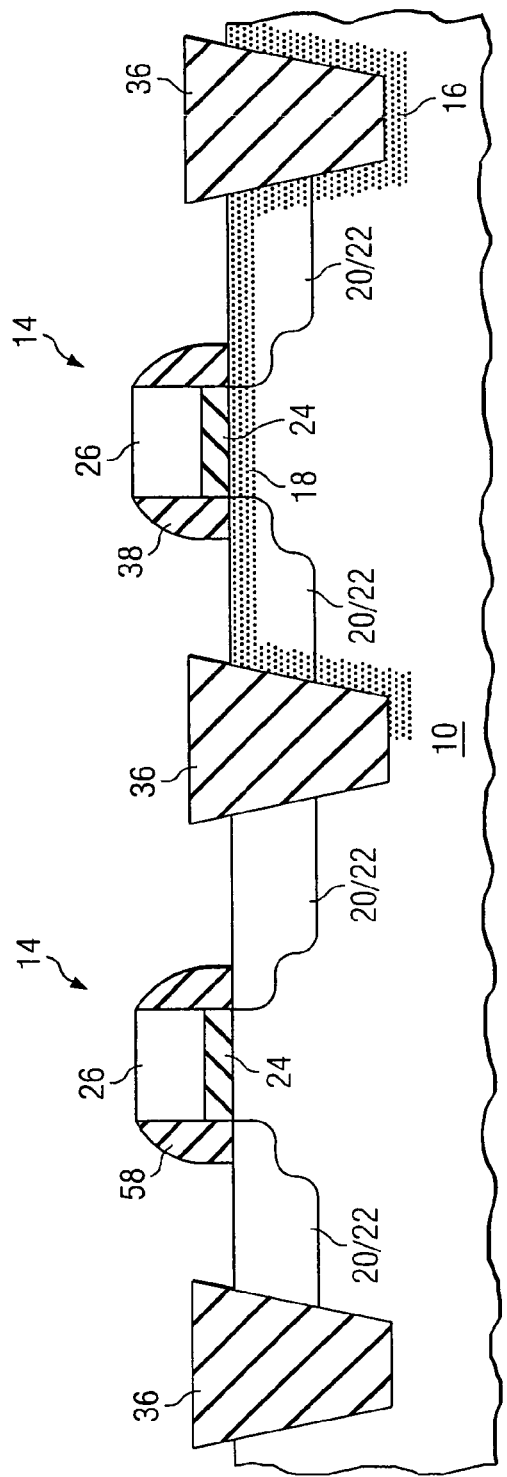

FIG. 4f illustrates the completion of the transistor device. The trench regions 28 (see FIG. 4a) are filled with an insulating material to form trench isolation regions 36. For example, the trenches can be lined with a first material, e.g., SiN, and filled with a second material, e.g., an oxide deposited using a high density plasma process. In some embodiments, the trench isolation can be used to apply stress to active area 10a and/or additional stress to active area 10b.

Gate dielectric 24 is deposited over exposed portions of the semiconductor body 10. In one embodiment, the gate dielectric 24 comprises an oxide (e.g., $SiO_2$), a nitride (e.g., $Si_3N_4$), or combination of oxide and nitride (e.g., SiON, oxide-nitride-oxide sequence). In other embodiments, a high-k dielectric material having a dielectric constant of about 5.0 or greater is used as the gate dielectric 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 24 can comprise other high-k insulating materials or other dielectric materials. As implied above, the gate dielectric 24 may comprise a single layer of material, or alternatively, the gate dielectric 24 may comprise two or more layers.

The gate dielectric 24 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 24 may be deposited using other suitable deposition techniques. The gate dielectric 24 preferably comprises a thickness of about 10 Å to about 60 Å in one embodiment, although alternatively, the gate dielectric 24 may comprise other dimensions.

In the illustrated embodiment, the same dielectric layer is used to form the gate dielectric 24 for both the p-channel and n-channel transistors. This feature is not required, however. In an alternate embodiment, the p-channel transistors and the n-channel transistor each have different gate dielectrics.

The gate electrode 26 is formed over the gate dielectric 24. The gate electrode 26 preferably comprises a semiconductor material, such as polysilicon or amorphous silicon, although alternatively, other semiconductor materials may be used for the gate electrode 26. In other embodiments, the gate electrode 26 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 26 comprises a doped polysilicon layer underlying a silicide layer (e.g., titanium silicide, nickel silicide, tantalum silicide, cobalt silicide, platinum silicide).

If the gate electrode 26 comprises FUSI, for example, polysilicon may be deposited over the gate dielectric 24, and a metal such as nickel can deposited over the polysilicon. Other metals may alternatively be used. The substrate 10 can then be heated to about 600 or 700° C. to form a single layer of nickel silicide. The gate electrode 26 can comprise a plurality of stacked gate materials, such as a metal underlayer with a polysilicon cap layer disposed over the metal underlayer. A gate electrode 26 between about 500 to 2000 Å thick may be deposited using CVD, PVD, ALD, or other deposition techniques.

The p-channel transistors and the n-channel transistor preferably include gate electrodes 26 formed from the same layers. If the gate electrodes include a semiconductor, the semiconductor can be doped differently for the p-channel transistors and the n-channel transistors. In other embodiments, the different types of transistors can include gates of different materials.

The gate layer (and optionally the gate dielectric layer) are patterned and etched using known photolithography techniques to create the gate electrodes 26 of the proper pattern. After formation of the gate electrodes, lightly doped source/drain regions can be implanted using the gate electrode 26 as a mask. Other implants (e.g., pocket implants, halo implants or double diffused regions) can also be performed as desired.

Spacers 38, which are formed from an insulating material such as an oxide and/or a nitride, can be formed on the sidewalls of the gate electrode 26. The spacers 38 are typically formed by the deposition of a conformal layer followed by an anisotropic etch. The process can be repeated for multiple layers, as desired.

Source/drain regions 20/22 can be formed in exposed surfaces of the active areas 10a and 10b. Preferably, ions (e.g., boron for the PMOS transistor 116 and arsenic and/or phosphorus for the NMOS transistor 118) are implanted, according to conventional methods.

While not shown, it is understood that an interlayer dielectric (ILD) layer will be formed over the transistors 14. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples. Typically, gate electrode and source/drain contacts (not shown) are formed through the interlayer dielectric. Metallization layers that interconnect the various components are also included in the chip, but not illustrated for the purpose of simplicity.

Figure 5A:
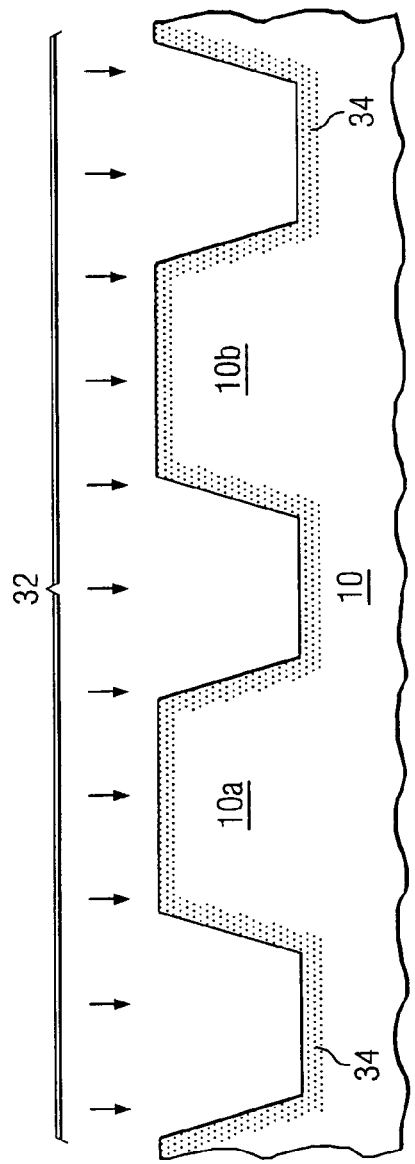
FIGS. 5a-5b provide cross-sectional views of a second embodiment process.

A second embodiment will now be described with respect to FIGS. 5a and 5b. The process begins with a wafer having the isolation trenches formed therein as shown in FIG. 4a. A blanket amorphizing implant is then performed as shown in FIG. 5a. This embodiment simplifies the process since the resist 30, and the associated lithography steps, have been eliminated. In one example, germanium ions are implanted into a silicon substrate to create amorphous layer 34 at the upper surface of the semiconductor body 10.

Figure 5B:
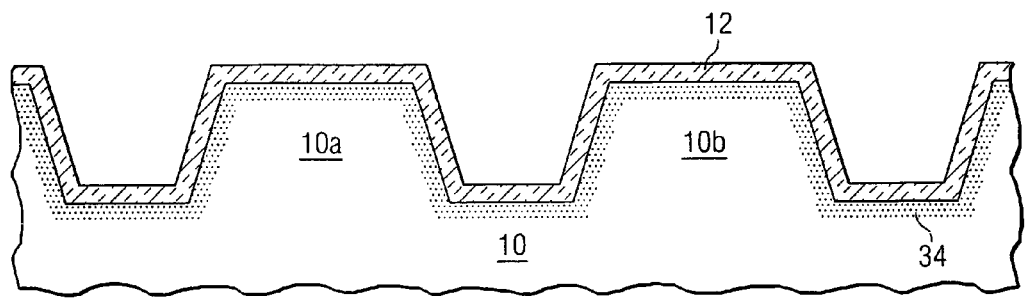

As shown in FIG. 5b, a stress-inducing liner 12 is formed over the semiconductor body 10. The stress-inducing liner 12 can be either a tensile or a compressive liner. As discussed above with respect to FIG. 4e, the wafer can be heated to recrystallize the upper surface of the semiconductor body 10. As before, it is preferable that a low temperature anneal be used for a compressive liner and a high temperature anneal be used for a tensile liner. The liner 12 can then be removed and semiconductor components can be formed.

With the substrate of FIG. 5b (after regrowth and liner removal), all of the active areas will experience the same type of stress. This may be desirable (or at least tolerable). In other examples, any stress from one of the transistor types (e.g., n-type or p-type) can be relieved before forming that type of transistor.

For example, if a tensile liner is deposited, the performance of the n-channel transistors (e.g., to be formed in one of the active areas 10a) will be enhanced. The compressive stress (i.e., the stress in the semiconductor created by the tensile liner) is not desired for the p-channel transistors and can be relieved (i.e., compensated for), for example by utilizing embedded silicon germanium in the other active region (e.g., active area 10b). Here, the silicon is etched and filled up with epitaxial SiGe in the source/drain regions only. Such a standard approach would remove much of the tensile strained Si and over compensate for the tensile strain in the channel. Alternatively, the stress can be relieved when the insulating material is deposited for the trench isolation 36 (see e.g., FIG. 4f). For example, an HDP shallow trench isolation (STI) can be used to relieve stress for the p-channel transistors because the compressive stress from the STI can compensate for the tensile strain from the stressed layer.

If a compressive liner is deposited, the performance of the p-channel transistors will be enhanced. The tensile stress is not desired for the n-channel transistors and can be relieved or compensated for. For example, embedded silicon carbon (SiC) can be utilized or an STI filled using HARP™ (high aspect ratio process), which is available from Applied Materials.

Figure 6:
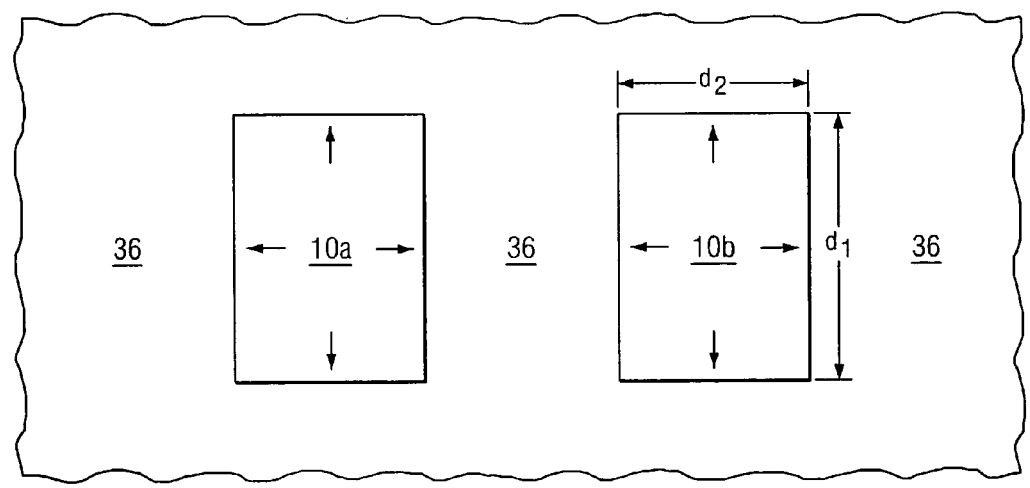
FIG. 6 illustrates a plan view of two active regions of the present invention.

In other embodiments, the stress does not need to be compensated. For example, a biaxial strain is desirable for both n-channel and p-channel transistors. A biaxially stressed layer will experience stress in a direction parallel to current flow and also in a direction perpendicular to current flow. FIG. 6 provides a plan view of biaxially stressed regions 10a and 10b. In order to maintain biaxial stress, it is preferred that the active areas be substantially square, i.e., have edges that are no more than 50% different in length (i.e., $\frac{2}{3} \leq d_2/d_1 \leq \frac{3}{2}$). In this case, it may be desirable to take wide transistors and include an additional STI so that a single wide transistor can be implemented as multiple narrower transistors in parallel.

Figure 7A:
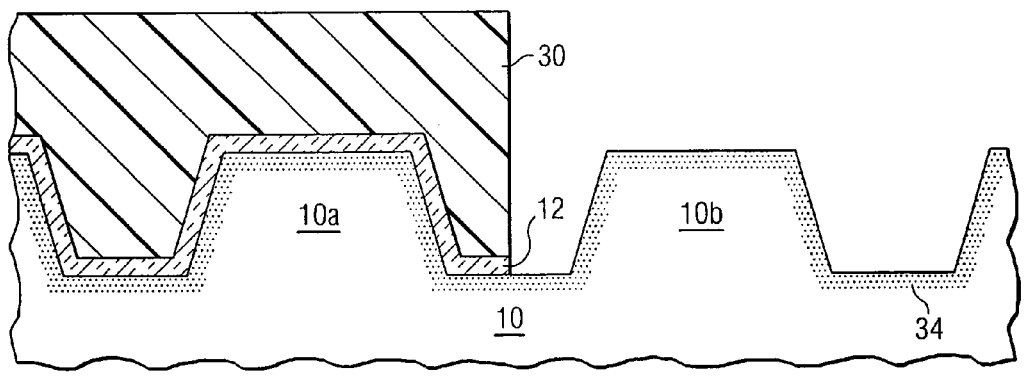
FIGS. 7a-7b provide cross-sectional views of a third embodiment process.
Figure 7B:
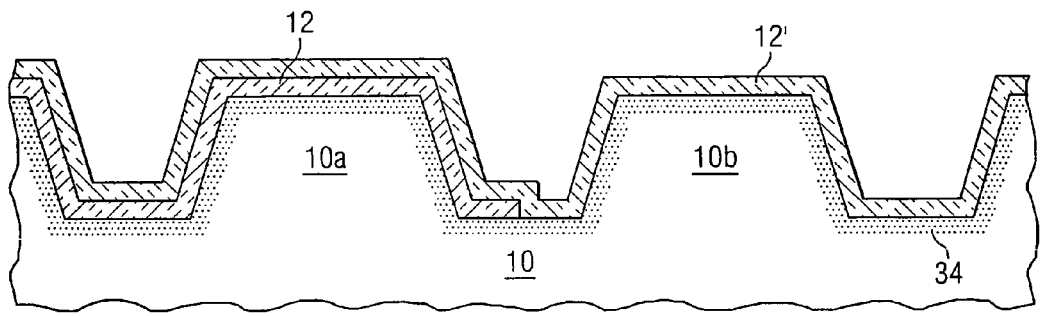

FIGS. 7a and 7b illustrate another embodiment process. Referring first to FIG. 7a, a resist layer 30 is deposited over the structure of FIG. 5b. The resist layer 30 is photolithographically patterned as discussed above with respect to FIG. 4c. The liner 12 over the active area 10b can then be removed. This structure is shown in FIG. 7a.

Referring now to FIG. 7b, the resist 30 is removed and a second liner 12' is formed over the semiconductor body. The liner 12 and second liner 12' preferably assert opposite stresses, e.g., the liner 12 is a compressive liner and the second liner 12' is a tensile liner, or vice versa. As shown in FIG. 7b, the second liner 12' can be formed over the first liner and in direct contact with the substrate 10b. Where the two liners overlap, the stress from the bottom liner 12 would be much higher than the stress of the upper liner 12'. This feature is especially true when the liner 12 is made thick enough, e.g., between about 20 nm and 200 nm (preferably 50 nm to 100 nm) thick. The second liner 12' can also have a thickness of about 20 nm to about 200 mm.

During the anneal process, the stress of the semiconductor body 10a or 10b will be affected by the overlying liner 12' or 12, respectively. Accordingly, the regions for n-channel transistors can be stressed compressively and the regions for the p-channel transistors can be stressed tensilely. Preferably, the anneal process includes two steps. This can be accomplished with a common anneal afterwards, or a high temperature anneal (e.g., 1100° C.) after the tensile liner is patterned. In the latter, another amorphization can be performed before the compressive liner is deposited (since the anneal would have recrystallized it). Then a low temperature anneal (e.g., 600° C.) can be performed.

In each of the previously described embodiments, the stress liners were formed after etching the isolation trenches 28 but before forming the transistors. One issue that may be of concern is implant damage around the STI edge, which may adversely affect the electrical properties of the device. These defects, however, are typically corrected by subsequent junction annealing steps.

Figure 8A:
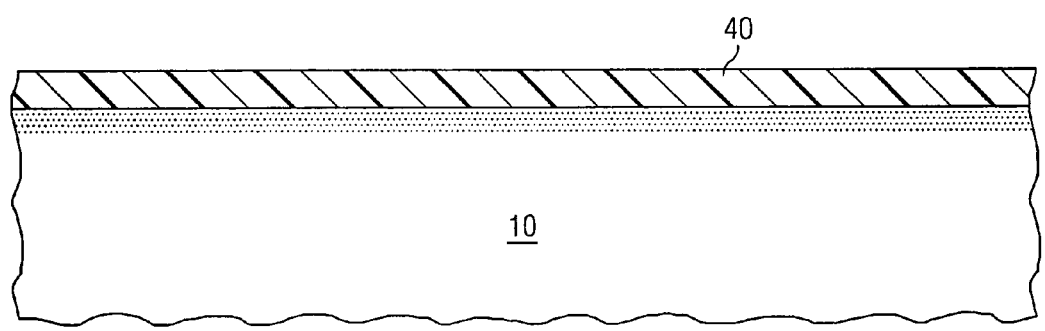
FIGS. 8a-8c provide cross-sectional views of a fourth embodiment process.
Figure 8B:
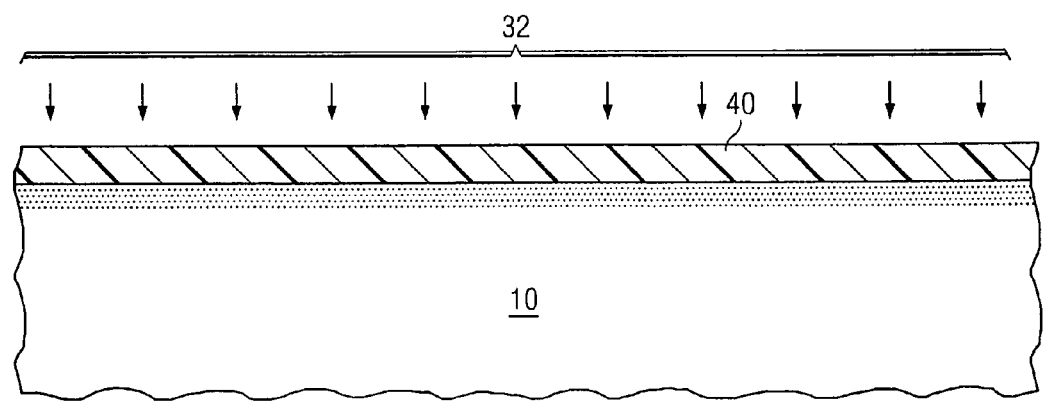
Figure 8C:
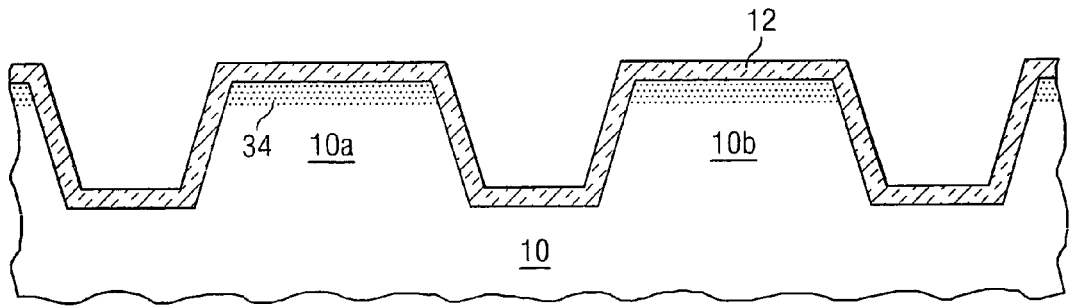

One embodiment that avoids possible implant damage beneath the isolation trenches is shown in FIGS. 8a-8c. Referring first to FIG. 8a, a semiconductor body 10 is provided. This can be the same type of semiconductor body as discussed earlier. A hard mask layer 40 can be formed over the semiconductor body 10. For example, a pad oxide can be formed over silicon and a pad nitride formed over the pad oxide.

The amorphization of the upper surface of the semiconductor body 10 is illustrated in FIG. 8b. In one example, an ion implantation step (e.g., implantation of germanium ions) can be performed as denoted by the arrows 32. In the preferred embodiment, this implantation is performed through the hard mask layer 40. This is preferred when the deposition temperature of the hard mask materials is high enough to affect the stress that was created by the anneal, which will be discussed below. Alternatively, a tensile nitride can be used for pad nitride 40 (e.g., if only using the biaxial approach in embodiment 2) and remain for CMP and STI processing. If the deposition process will not affect the stress, then the hard mask can be formed after recrystallization.

The trench etch and liner deposition steps are shown in FIG. 8c. These steps can be performed as discussed above. The resulting structure can be processed as discussed above, including the variations of the embodiments discussed.

In an alternative embodiment, the substrate can be masked as shown in FIG. 4c prior to performing the amorphization of FIG. 8b. In this manner, only selected ones of the active areas will be stressed.

In another alternate embodiment, which is not illustrated, the amorphization step of FIG. 8b can be performed before deposition of the hard mask layer 40. In this embodiment, the upper surface is amorphized (e.g., by Ge implantation) and the stress-inducing liner is deposited. The regrowth anneal can then be performed to recrystallize the upper surface. At this point, the wafer can be processed using standard process, e.g., by depositing the hard mask to begin STI formation. In another embodiment, the stress-inducing liner 12 can be used as the hard mask layer 40, thereby saving some processing steps.

This concept of stress engineering before forming the gate can be used in alternative device architectures such as Fin-FETs or multi-gated devices. One example is shown in FIGS. 9a-9e.

Figure 9A:
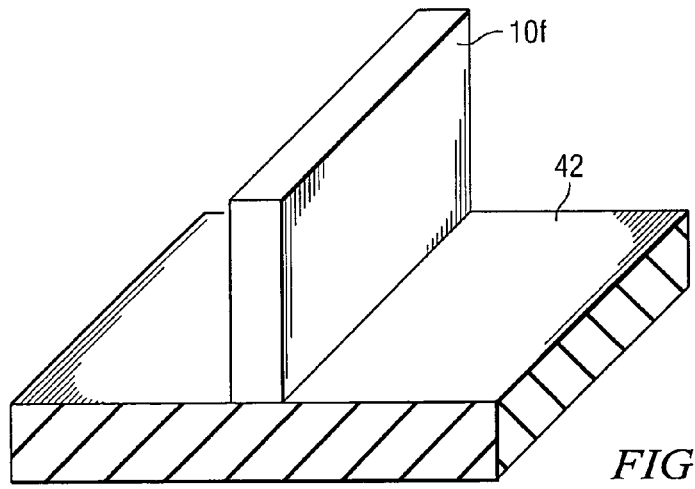
FIGS. 9a-9e provide perspective views of a fifth embodiment process.
Figure 9B:
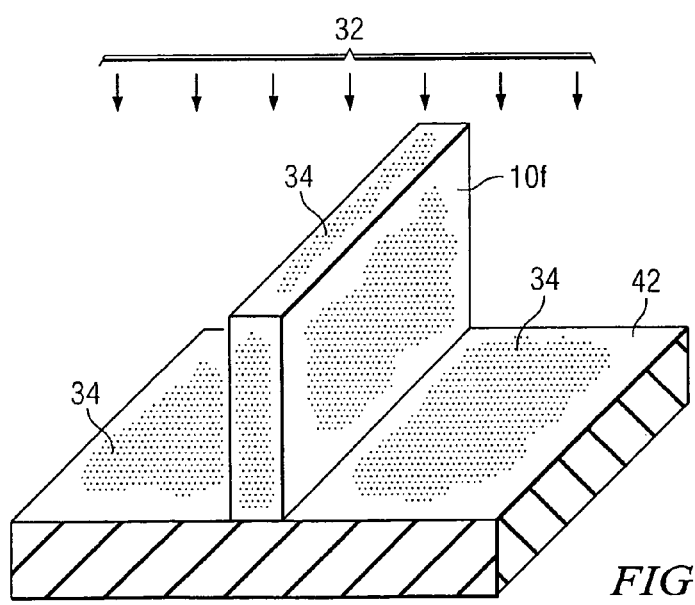

Referring first to FIG. 9a, a fin 10f is formed over an insulating layer 42. The insulating layer 42 could be, for example, a buried oxide layer formed as part of an SOI substrate. The insulating layer 42 could overlie a substrate (not shown) made of silicon or another material. Alternatively, the fin 10f can be formed in a semiconductor without overlying an insulator 42. To form the structure of FIG. 9a, an SOI wafer is provided. The upper silicon layer is etched to form islands and fins, thereby electrically isolating each device.

After the silicon etch, the substrate is amorphized to a desired depth, as shown by the arrows 32. As before, the amorphization can be performed with a germanium implant. The deeper the amorphous region 34, the higher the retained stress level will be. This depth is limited though by the need to maintain a crystalline semiconductor seed layer under the amorphous region 34. In one example, a fin 10f that is 100 nm high could include an amorphous region 34 that is about 70 nm. In other examples, the amorphous region 34 could extend to a depth that is between about 50% and 90% (or more preferably between 65% and 75%) of the height of the fin 10f.

Figure 9C:
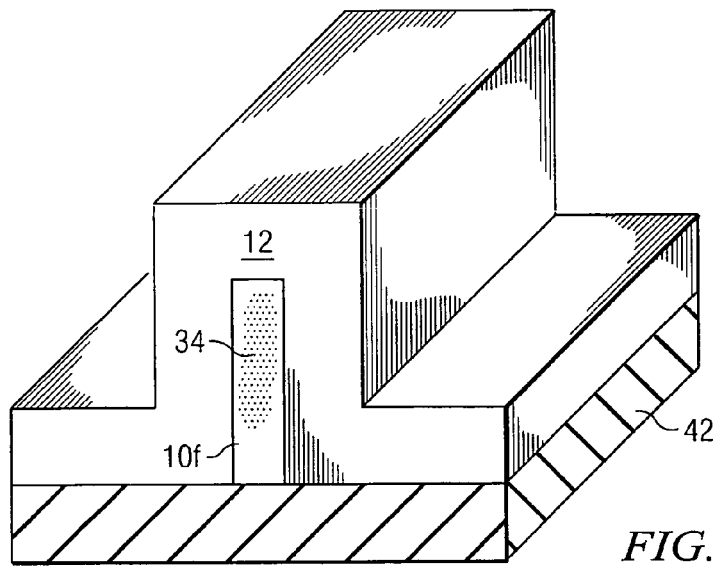

After amorphization, the stress liner 12 is deposited, as shown in FIG. 9c. As in the earlier embodiments, the stress liner 12 could be a combination of layers, e.g., $SiO_2+Si_3N_4$, or a single layer, e.g., $Si_3N_4$. The tensile or compressive stress level of this liner is dependent on the device design including fin orientation and device type, such as pMOS and nMOS. As such, it may involve a separate stress liner for each device type. However, it is possible that a single liner may be suitable for both types. If a different stress liner is needed a masked approach similar to that described in FIG. 4 or FIG. 7 would be applicable.

Figure 9D:
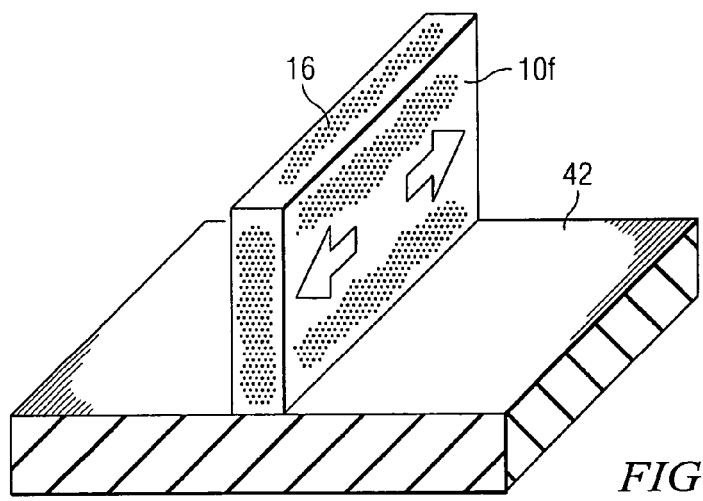

After liner deposition, an RTA step, typically above 600° C., would recrystallize the amorphous Si. Other annealing temperatures could be used, as discussed herein. During regrowth, the stress of the liner 12 will be incorporated into the grown silicon 16. As illustrated by FIG. 9d, the liner 12 would then be removed and the fin 10f (or at least the upper portion of the fin 10f) would remain stressed, either tensile or compressively, along the sidewalls of the fin 10f.

It is likely that the mobility change, due to stress on the sidewall of the fin 10f, is different to that on the top of the fin since there are two different lattice planes on the surface. However, most of the current flows along the side of the fin as it is typically higher than it's width. As such, the stress liner would be optimized for the sidewall mobility and any degradation of the mobility on the top surface (if any) will have a minor effect on device performance.

Figure 9E:
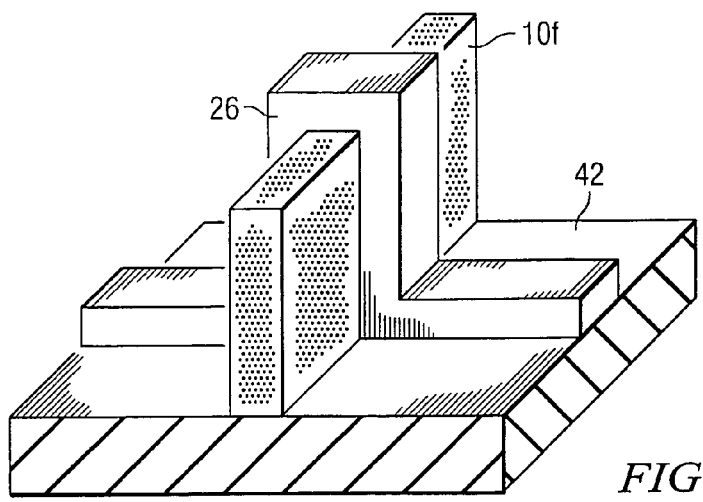

FIG. 9e illustrates the structure after formation of a gate 26. The gate can be formed by depositing a conductor and etching the conductor to the appropriate pattern. The gate can be formed from any conductor, such as polysilicon, metal, metal nitride or conductive polymers. Exposed portions of the fin 10f can then be doped to create source and drain regions.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   providing a semiconductor body;
   etching an isolation trench in the semiconductor body;
   after etching the isolation trench, amorphizing an upper surface of the semiconductor body;
   forming a liner over the amorphized upper surface;
   annealing the upper surface;
   filling the isolation trench after annealing the upper surface; and
   forming a transistor at the upper surface.

2. A method of making a semiconductor device, the method comprising:
   providing a semiconductor body;
   etching an isolation trench in the semiconductor body;
   after etching the isolation trench, amorphizing an upper surface of the semiconductor body;
   forming a liner over the amorphized upper surface;
   annealing the upper surface;
   forming a transistor at the upper surface; and
   removing the liner after annealing the upper surface but prior to forming the transistor.

3. The method of claim 2, wherein the liner comprises a stress inducing liner.

4. The method of claim 1, wherein annealing the upper surface comprises performing a rapid thermal anneal at a temperature less than about 700° C.

5. The method of claim 1, wherein amorphizing the upper surface comprises implanting through a material into the upper surface.

6. The method of claim 1, wherein annealing the upper surface comprises performing an anneal at a temperature greater than about 1000° C.

7. The method of claim 1, wherein the semiconductor body comprises a semiconductor fin.

8. A method of making a semiconductor device, the method comprising:
   providing a semiconductor body;
   forming an isolation trench in the semiconductor body;
   after forming the isolation trench, amorphizing an upper surface of the semiconductor body adjacent the isolation trench;
   depositing a stress-inducing liner over the upper surface of the semiconductor body;

annealing the upper surface of the semiconductor body such that the upper surface is in a substantially crystalline state;

removing the stress-inducing liner;

filling the isolation trench with an insulating material after removing the stress-inducing liner; and forming an electronic device at the upper surface of the semiconductor body adjacent the isolation trench.

9. The method of claim 8, further comprising forming a second electronic device at the upper surface of the semiconductor body, the second electronic device being laterally spaced from the electronic device, the method further comprising relieving any stress from the upper surface beneath the second electronic device prior to forming the second electronic device.

10. The method of claim 9, wherein the electronic device comprises an n-channel field effect transistor and the second electronic device comprises a p-channel field effect transistor.

11. The method of claim 10, wherein relieving any stress comprises converting a tensile stress into a compressive stress.

12. The method of claim 10, wherein relieving any stress comprises utilizing embedded silicon germanium in a region of the semiconductor body adjacent the second electronic device.

13. The method of claim 9, wherein the electronic device comprises a p-channel field effect transistor and the second electronic device comprises an n-channel field effect transistor, and wherein relieving any stress comprises utilizing embedded silicon carbon in a region of the semiconductor body adjacent the second electronic device.

14. The method of claim 9, wherein relieving any stress comprises filling the isolation trench with a stress-inducing material while performing the step of filling the isolation trench with an insulating material.

15. The method of claim 8, wherein forming an isolation trench comprises forming an isolation trench surrounding an active area and wherein the steps of amorphizing, depositing and annealing create a biaxial stress in the active area.

16. The method of claim 15, wherein forming an isolation trench comprises defining a plurality of active areas, and wherein forming an electronic device comprises forming an n-channel field effect transistor in a first one of the active areas and forming a p-channel field effect transistor in a second one of the active areas, both the n-channel field effect transistor and the p-channel field effect transistor having a channel formed in a biaxially stressed surface of the semiconductor body.

17. A method of making a semiconductor device, the method comprising:

providing a semiconductor fin overlying a portion of a substrate;

amorphizing at least an upper portion of the semiconductor fin;

forming a stress-inducing liner over the semiconductor fin;

annealing the semiconductor fin; and removing the stress-inducing liner.

18. The method of claim 17, further comprising forming a gate electrode over a portion of the fin.

19. The method of claim 17, wherein amorphizing an upper portion of the semiconductor fin comprises amorphizing the semiconductor fin to a depth that is between about 50% and 90% of a height of the semiconductor fin.

20. The method of claim 19, wherein amorphizing an upper portion of the semiconductor fin comprises amorphizing the semiconductor fin to a depth that is between about 65% and 75% of the height of the semiconductor fin.

21. The method of claim 17, wherein providing a semiconductor fin overlying a portion of a substrate comprises providing a semiconductor fin overlying a buried insulator.

22. A method of making a semiconductor device, the method comprising:

providing a semiconductor fin overlying a portion of a substrate;

amorphizing at least an upper portion of the semiconductor fin;

depositing a stress-inducing liner over the semiconductor fin;

annealing the semiconductor fin such that the semiconductor fin is at least a substantial part of the fin is in a crystalline state;

removing the stress-inducing liner; and forming a gate electrode over a portion of the semiconductor fin.

23. The method of claim 22, wherein amorphizing an upper portion of the semiconductor fin comprises amorphizing the semiconductor fin to a depth that is between about 50% and 90% of a height of the semiconductor fin.

24. The method of claim 23, wherein amorphizing an upper portion of the semiconductor fin comprises amorphizing the semiconductor fin to a depth that is between about 65% and 75% of the height of the semiconductor fin.

25. The method of claim 22, wherein at least the upper portion of the semiconductor fin remains stressed after removing the stress-inducing liner.

26. The method of claim 25, wherein the semiconductor fin is tensile stressed.

27. The method of claim 25, wherein the semiconductor fin is compressively stressed.

28. The method of claim 17, wherein the stress-inducing liner is removed after annealing the semiconductor fin but prior to forming a transistor.

29. The method of claim 22, wherein the stress-inducing liner is removed after annealing the semiconductor fin but prior to forming the gate electrode.

* * * * *